Oct. 4, 1966 R. E. JOHNSON ETAL 3,277,006
DOUBLE DOPING OF III-V COMPOUND SEMICONDUCTOR MATERIAL
Original Filed June 28, 1960
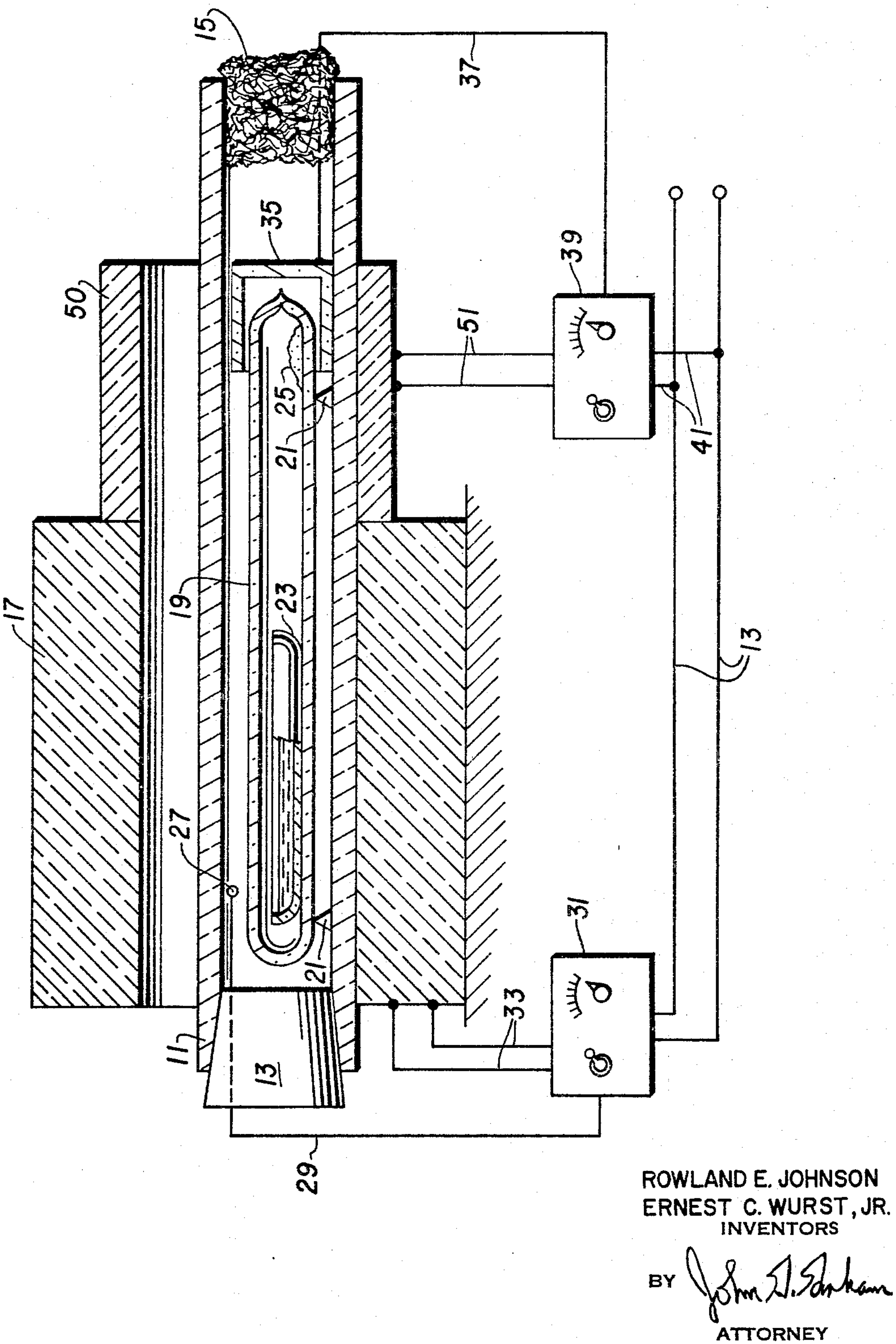
ROWLAND E. JOHNSON
ERNEST C. WURST, JR.
INVENTORS
BY John D. [signature]
ATTORNEY 3,277,006

DOUBLE DOPING OF III–V COMPOUND SEMICONDUCTOR MATERIAL

Rowland E. Johnson and Ernest C. Wurst, Jr., Dallas, Tex., assignors to Texas Instruments Incorporated, Dallas, Tex., a corporation of Delaware Original application June 28, 1960, Ser. No. 206,050. Divided and this application Sept. 10, 1965, Ser. No. 498,180
12 Claims. (Cl. 252—62.3)

This application is a divisional of application Serial No. 206,050, filed June 28, 1960.

This invention relates to compound semiconductor processes and devices and more particularly to a process for producing Group III–V compound semiconductor material suitable for use in "tunnel" diodes.

Although the Group III–V compound semiconductor materials, particularly gallium arsenide, are very useful for producing semiconductor devices, difficulties in adding required amounts of significant impurities or "dopes" to the pure material to produce p and n-type regions have been encountered. Such problems are prevalent in making compound semiconductor tunnel diodes.

Tunnel diodes are crystal semiconductor devices having single, very sharp p-n junctions, the crystals being doped to degeneracy on either side of the junctions, i.e., containing relatively large amounts of donor or acceptor impurities. Tunnel diodes exhibit a current-voltage characteristic having a large negative resistance region, and thus are useful in making oscillators and amplifiers.

Difficulties prevail in achieving appropriate doping levels in Group III–V compound semiconductor materials for making tunnel diodes having low junction current operating characteristics. Heretofore, the only technique for producing such a tunnel diode having a low junction current was etching the junction to extremely small dimensions, a highly impractical technique to achieve junction currents in the order of 100 micro amps.

Briefly, in accordance with the invention, a compound semiconductor such as gallium arsenide is produced concurrently doped to degeneracy with a p-type impurity such as zinc and to the maximum solid solubility with copper. It is recognized that copper is a p-type dopant; however, it will not provide a degenerate doping level in Group III–V compounds. The compound semiconductor formed is gradient frozen and separated into single crystals. The single crystals of gallium arsenide which remain doped to degeneracy with zinc and contain copper in an amount equivalent to the maximum limit of solid solubility, are fabricated into tunnel diodes.

The tunnel diode is made from the compound semiconductor, such as gallium arsenide, by forming a region therein which is doped to degeneracy with an n-type conductivity impurity producing the p-n junction required. Suitable materials and techniques for making the n-type contact region in the single crystal gallium arsenide are described in U.S. Patent No. 3,012,175, granted to M. E. Jones et al., December 5, 1961, and assigned to the same assignee as the instant application.

It is therefore an object of the invention to provide a method of forming Group III–V compound semiconductor material which may be fabricated into tunnel diodes, having relatively low junction current densities:

A further object of the invention is to provide a method of forming gallium arsenide material which may be fabricated into tunnel diodes having relatively low junction current densities;

Still another object of the invention is to provide a method of producing p-type gallium arsenide doped to the maximum solid solubility with copper which is useful for making low junction current tunnel diodes.

A still further object of the invention is to provide a Group III–V compound semiconductor tunnel diode having an improved stability resulting from the inclusion of an excess amount of copper in the compound.

These and other objects and advantages of the invention will become apparent as the following description proceeds, taken in conjunction with the appended claims and the accompanying drawing in which the sole figure is a sectional view of the apparatus for producing Group III–V compound semiconductor material in accordance with the principles of the invention.

One manner in which highly doped ($10^{20}$ carriers per cc.) p-type conductivity compound semiconductor material may be formed, containing copper at the maximum limit of solid solubility, will now be described using gallium arsenide as a typical compound semiconductor and making reference to the sole figure which illustrates suitable apparatus therefor.

The apparatus comprises a ceramic tube 11 of generally cylindrical form, which may be closed at one end by a suitable plug 13 and at the other end by a plug 15 of quartz or glass wool to prevent cool air currents from flowing through the tube. The tube 11 is partially situated within a furnace 17 of ceramic, metal, or other suitable material. A second furnace 50 surrounds another portion of the tube 11, as shown. Within the tube 11 is a sealed quartz reaction chamber 19 resting upon supports 21 provided therefor. The sealed chamber 19 contains at one end, well within the furnace 17, a quartz boat 23, and at its other end, which is exterior to the furnace 17 but within the furnace 50, a quantity of arsenic, the more volatile element of the compound semiconductor gallium arsenide to be formed. A thermocouple 27, connected by a wire 29 to a temperature controller 31, is mounted within the tube 11. The controller 31 effects regulation of the temperature at one end of the furnace 17 through control of the power delivered thereto through wires 33. A support 35 surrounding the other end of the sealed chamber 19 contains a second thermocouple which is connected by means of a wire 37 to a second temperature controller 39 which effects regulation of the temperature in furnace 50 through control of the power delivered thereto through wires 51. Wires 13 serve the furnaces and the temperature controllers with electrical energy.

The boat 23 within one end of the sealed chamber 19 contains an amount of gallium, one element of the compound semiconductor gallium arsenide to be formed, and an excess amount of the p-type doping agent along with an excess amount of copper. By an excess amount of doping agent is meant that amount which will dope the gallium arsenide to degeneracy. By an excess amount of copper is meant that amount required to exceed the solid solubility of copper in the total amount of solid gallium arsenide material which will be formed within the boat 23. The material 25 at the other end of the sealed chamber 19 is the more volatile element or arsenic of the compound gallium arsenide to be formed. The temperature controller 31 is adjusted to maintain the temperature of the boat 23 above the melting point of gallium arsenide, hence, the temperature would be above 1234° C. Furnace 17 is so constructed that a 20–45° C. temperature gradient from one end to the other of boat 23 is maintained. Such a temperature gradient may be achieved through appropriate placement of the heating coils within the furnace, or by other known means. The hotter end of the boat 23 may be maintained at approximately 1260° C. to 1295° C. during formation of gallium arsenide. The end of the sealed chamber 19 containing the material 25 should be maintained at the temperature at which the vapor pressure of the material 25 is correct to produce a stoichiometric melt of the compound semiconductor in the boat 23. Since in this example the material 25 is arsenic, the end of chamber 19 containing the arsenic should be maintained at a temperature of approximately 607° C. In this manner, the temperature at the cool end of the chamber 19 is sufficient to volatilize the arsenic contained therein, and the temperature at the hot end of the chamber 19 is sufficient to maintain boat 23 and its contents above the melting point of the compound gallium arsenide. At these temperatures, the volatilizing arsenic forms an atmosphere within the chamber 19, and combines with the element gallium in the boat 23 to produce the stoichiometric molten compound semiconductor gallium arsenide containing an excess of the doping agent and copper.

After maintaining the molten material under the conditions outlined above for a period of time sufficient for the stoichiometric compound gallium arsenide to form, which may be about five hours, the melt is subjected to gradient freezing by gradually reducing the temperature in the furnace 17 over a period of from four to eight hours while maintaining substantially constant the temperature gradient of about 20–45° C. across the boat 23. In this manner, the compound semiconductor gallium arsenide begins freezing at the cooler end of the boat 23, and progressively freezes until the temperature at the hot end of the boat 23 falls below the melting temperature of gallium arsenide. Due to the segregation characteristics of the dope and the copper in the freezing material, the excess materials will be swept by the advancing freezing interface of the crystalline mass to the last frozen end of the compound gallium arsenide, providing a supersaturated portion of material at the finally frozen end of the crystalline mass.

The frozen mass will usually be polycrystalline. However, when slowly cooled as described, the individual crystals in the mass will be quite large and, on occasion, the mass will seed itself and freeze as a single crystal. Alternatively, the molten mass can be seeded to cause a single crystal to grow during cooling.

By this method, there is formed a crystalline mass of highly doped Group III–V compound semiconductor material. Although the mass is polycrystalline, the individual crystals of the material are so large that slices of the material, as formed, are suitable for fabrication directly into tunnel diode devices. After the formation of the crystalline mass itself, the first frozen end, in which the individual crystals are too small, and the last frozen end, which is supersaturated with the doping materials and copper, may be cut off to leave the more desirable middle portion. This middle portion is then sliced and diced into wafers, which are then suitably etched and polished preparatory to producing devices. After preparation of the wafers, suitable contacts are attached to the wafers, one ohmic and one rectifying. Leads are then attached to the contacts, and the devices masked for etching. The junction area is etched down to approximately 50 to $200 \times 10^{-6}$ cm. sq. The masking is then removed and the device is cleaned and encapsulated to provide a finished product. Hereinafter follows a specific example of the method and article of the invention.

*Example I*

Using the apparatus shown in the drawing, 25 grams of 99.9999% pure gallium, 1 gram of 99.95% pure zinc and 0.005 gram of 99.95% pure copper were placed into the boat 23, and 40 grams of 99.9995% pure arsensic were placed at the right end of sealed chamber 19. The boat 23 was placed toward the left end of chamber 19. The chamber 19 was then evacuated, sealed, and arranged in tube 11 within the gradient freeze furnace and the vapor pressure control furnace 50, as shown in the drawing. The furnace 17 was adjusted to establish one end of the boat 23 at a temperature of 1290° C. and the other end at 1245° C. thus providing a 45° C. temperature gradient along the boat 23. The other end of the chamber 19 was heated to an arsenic control temperature of 607° C. The temperature conditions were held for a period of five hours, during which time molten stoichiometric gallium arsenide containing dissolved zinc and copper formed in boat 23. The gallium arsenide was then frozen (by slowly lowering the power to furnace 17) over an eight hour period, all the while preserving the temperature gradient along the boat 23. Next, the boat 23 was cooled to 600° C. over a four-hour period and then the chamber 19 containing the boat 23 was removed from the furnace and cooled to room temperature. After removing the gallium arsenide ingot from the sealed chamber 19 and the boat 23, it was evaluated by preparing diodes therefrom by slicing and dicing the material, lapping and etching the dice, and alloying a tin dot to one side of each die to form a rectifying contact and soldering (with zinc-doped gold) a copper ohmic contact tab to the other side of each die. The diodes were etched to form a suitable junction area and tested to determine the tunnel diode characteristics. The characteristics of the tunnel diodes formed are presented in Table I below.

TABLE I

| Unit No. | Junction area $\times 10^6$ cm.$^2$ | Ip Ma | Iv Me | Ip/Iv | Peak Current Density $J_{P_2}$ Amps/cm.$^2$ |
|---|---|---|---|---|---|
| 1 | 44.1 | .92 | .05 | 18.4 | 21 |
| 2 | 69.0 | .29 | .012 | 24.2 | 4.2 |
| 3 | 142.0 | .37 | .026 | 14.2 | 2.6 |
| 4 | 81.0 | .3 | .01 | 30.0 | 3.7 |

There has been described, in this specification, a new and improved tunnel diode, diode material, and method and apparatus for producing such diodes. It is realized that the above description will suggest to other skilled in the art new and other manners of using the principles thereof without departing from the spirit of this invention. It is therefore, intended that this invention be limited only by the scope of the appended claims.

What is claimed is:

1. The method of forming a Group III–V compound semiconductor material for tunnel diodes comprising the steps of forming a melt of said compound by contacting a mixture of a Group III element of the periodic table along with an excess of a p-type doping agent and an excess of copper for said compound with a vapor of a Group V element of the periodic table, and then progressively freezing said melt from one end.

2. The method of claim 1 wherein said Group III element is selected from the group consisting of aluminum, indiu mand gallium and said Group V element is selected from the group consisting of phosphorus, arsenic and antimony.

3. The method of claim 2 wherein said doping agent is zinc.

4. The method of claim 1 wherein said Group III element is gallium and said Group V element is arsenic.

5. The method of claim 4 wherein said doping agent is zinc.

6. The method of making a highly doped Group III–V compound semiconductor material for low current tunnel diodes comprising the steps of heating in a reaction chamber a mixture of a Group III element of the periodic table along with an excess of a p-type doping agent and an excess of copper to a temperature above the melting point of said compound, providing in said reaction chamber a quantity of a Group V element of the periodic table, said quantity being in excess of the stoichiometric amount, heating said Group V element to a temperature to maintain a prescribed vapor pressure of said Group V element within said chamber to ensure combination of said Group III and said Group V elements, maintaining said mixture and said Group V element at their respective temperatures for a period of time to cause formation of a melt of said compound containing an excess of said p-type doping agent and said copper, and freezing said melt of the compound so formed, said freezing being effected progressively through said melt over a period of time.

7. The method of claim 6 wherein said Group III element is selected from the group consisting of aluminum, gallium and indium and said Group V element is selected from the group consisting of phosphorus, arsenic and antimony.

8. The method of claim 7 wherein said doping agent is zinc.

9. The method of claim 6 wherein said Group III element is gallium and said Group V element is arsenic.

10. The method of claim 9 wherein said doping agent is zinc.

11. The method of making a highly doped Group III–V compound semiconductor material for low current tunnel diodes comprising the steps of providing a reaction chamber having at least a high temperature zone and a low temperature zone, heating in said high temperature zone a mixture of a Group III element and an excess of a p-type doping agent and an excess of copper, providing in said low temperature zone an amount of a Group V element greater than the amount required to form a molten compound with said Group III element, controlling the temperature in said low temperature zone such that at least a portion of said Group V element vaporizes, producing the vapor pressure of said Group V element in said reaction chamber required for combination with said Group III element, controlling the temperature in said high temperature zone such that said mixture is maintained above the melting point of said Group III–V compound for a time sufficient to assure reaction between said Group III element and said Group V element to form a melt of said Group III–V compound, establishing a temperature gradient through said melt, lowering the temperature of said high temperature zone while maintaining said temperature gradient to freeze said melt progressively from one end.

12. The method of claim 11 wherein said temperature gradient is from 20° C. to 45° C.

No references cited.

DAVID L. RECK, *Primary Examiner.*

N. F. MARKVA, *Assistant Examiner.*